United States Patent [19]
Kleindiek

[11] Patent Number: 5,994,820
[45] Date of Patent: Nov. 30, 1999

[54] ELECTROMECHANICAL POSITIONING UNIT

[76] Inventor: Stephan Kleindiek, Melanchthonstrasse 31, Tübingen, Germany

[21] Appl. No.: 09/276,605

[22] Filed: Mar. 25, 1999

Related U.S. Application Data

[63] Continuation of application No. 08/836,536, filed as application No. PCT/DE95/01482, Oct. 21, 1995.

[30] Foreign Application Priority Data

Nov. 15, 1994 [DE] Germany .............................. 44 40 758

[51] Int. Cl.$^6$ .............................. H02N 2/00; H02N 2/04; G05D 3/10
[52] U.S. Cl. ........................................... 310/329; 310/328
[58] Field of Search ..................................... 310/317, 328, 310/329

[56] References Cited

U.S. PATENT DOCUMENTS 5,798,600  8/1998  Sager et al. .............................. 310/330

FOREIGN PATENT DOCUMENTS 0 464 764 A1  2/1991  European Pat. Off. ........ G05B 19/40
WO 94/06160  3/1994  WIPO .............................. H01L 41/09

OTHER PUBLICATIONS

Agrait, N., "Vertical Inertial Piezoelectric Translation Device for a Scanning Tunneling Microscope," Jan. 1992, Rev. Sci. Instrum. 63 (1), pp. 263–264.

*Primary Examiner*—Thomas M. Dougherty
*Attorney, Agent, or Firm*—Kennedy Covington Lobdell & Hickman

[57] ABSTRACT

The invention relates to an electromechanical positioning unit formed as an inertial drive to position objects with atomic scale positioning precision and with displacement ranges up to centimeters. The positioning unit contains at least one preferably tube shaped piezo electric actuator for transmitting electrically controllable inertial driving motions to a slider. The object of the invention is a slider consisting of at least one part of relatively high mass (mass unit) and of at least one flexible deformable part (flexible unit) allowing the frictional forces to be adjustable by bending the flexible parts and the mass part providing high loading capacity of the positioning unit. By combining these two parts it is possible to position heavy objects and to exert forces necessary to drive tools.

21 Claims, 5 Drawing Sheets and

ELECTROMECHANICAL POSITIONING UNIT

This application is a continuation of U.S. application Ser. No. 08/836,536, filed May 8, 1997 is still pending, which was the National Stage of International Application No. PCT/DE95/01482, filed Oct. 21, 1995.

BACKGROUND OF THE PRESENT INVENTION

The invention relates to an electromechanical positioning unit according to the generic term in claim 1. It particularly concerns a positioning unit formed as an inertial driving mechanism with at least one tube-shaped piezoelectric actuator with a movable slider. The actuator has electrodes for connecting it to variable voltages for electrically controlling its motion. The slider is to be moved inside this piezo actuator in the direction of the piezo movements along a tube-shaped sliding surface.

Positioning units of this kind with nanometer precision, activated by piezo actuators based on the principle of inertial driving, are used as positioners with atomic resolution, analysis tools (e.g. scanning tunneling microscope) and tools in micro- and nanotechnology. In these inertial drives the displacement of a slider relative to a sliding surface is achieved by high acceleration of the sliding surface so that the inertial force of the slider exceeds the frictional force and the slider can not follow the motion of the sliding surface.

Especially compact forms of the positioning unit are the one-axis inertial drives as described in DE 38 22 504 Al, in WO-Al-94/06160 and in Review Sci. Instr. 63 (1) (January 1992, pages 263/264). According to these articles one or several piezo actuators move a sliding surface fast and slowly. This particularly tube-shaped sliding surface symmetrically surrounds the slider.

In DE 38 22 504 Al a micromanipulator with several sliders supporting and moving an object is described. The sliders with support heads directly supporting the object are to be moved piezo-electrically inside a tube-shaped sliding surface. However, the frictional force of these sliders having the shape of a cylinder-bolt and not having any flexible elements are not adjustable.

The slider of the positioning unit described in WO-Al-94/06160 ("low-mass support means") is wire-shaped and its frictional force is adjustable by its flexible bendable shape but limited to small variations of the bending. That means only a small bending range is allowed to create a reasonable frictional force. This form of the slider allows inertial driving only if the frictional force is very small. Thus a tip, e.g. the tip of a scanning tunneling microscope, can be moved but not heavy objects. The slider can only exert extremely small forces because these forces are limited to the strength of the frictional force.

Furthermore the forces that can be exerted to the slider in WO-Al-94/06160 are limited by the power capacity of the piezo actuator. The transition from adhesion to sliding strongly depends on the shape of the impulse transmitted from at least one of the piezo actuators to the sliding surface and depends on the mass of the slider. It is also depending on the coefficients of friction of the different materials involved. The piezo actuators depolarize if the applied voltages exceed say a few 100 Volts and after that can not move any more thus limiting the transmission of power into the inertial drive.

In "Review Sci. Instr." 63 (1), January 1992, pages 263/264, a slider made of two halves of a cylinder cut along its axis is described, both cylinder halves hold inside a tube-shaped piezo actuator by frictional forces. For this purpose a spring is introduced between the two halves protecting them from falling out of the tube but allowing the two halves to be moved by piezo forces along the axis of the tube. From this it is known that it is extremely difficult to adjust the spring mechanically so that the two halves of the slider can be moved by piezo forces along the axis of the tube. The mechanical construction of the slider with the two halves of the cylinder and the spring, that is difficult to adjust, is so complicated that the diameter of the piezo actuator can not be less than 19 min to 20 mm practically. The bulkiness of the whole construction makes it sensitive for mechanical disturbance from outside like acoustic waves from walking steps making the positioning with atomic precision impossible normally without special vibration isolation systems.

The practical application of a positioning unit affords that the drive is tolerant against variations of the frictional forces arising from aging, dust, corrosion of the slider, change of the spring constant etc. This tolerance is not given by the unit in Review Sci. Instr. 63 (1). In this article the motion of the slider against gravity could only be achieved by driving the "Piezoelectric ceramics" with voltages exceeding 50 volts. Operation against forces larger than gravity is not possible; particularly the unit can lift nothing by itself except the slider.

According to the above mentioned Review Sci. Instrum. 63 (1) the slider-mass consists of two cylinder halves that are pressed against the friction tube wall with the help of a spring. If during operation both mass parts have different friction against the friction tube wall, which can hardly be avoided in "micro"-practice, both mass parts run asynchronous. By this they can tilt and stick in the friction tube. So a substantial disadvantage of the known device is, that the slider always must consist of two cylinder halves and therefor of two mass units, that are pressed transversally to the transport direction against the inner wall of the friction tube.

SUMMARY OF THE PRESENT INVENTION

The invention's underlying task is to remove the drawbacks of the above mentioned forms of sliders and by this to create an inertial drive which can be easily adjustable through its tolerance in feed per driving impulse, that can move heavy loads and exert or transmit high forces to objects and that can perform centimeter—(cm)—motions with nanometer—(nm)—precision without protection against usual mechanical disturbances in a normal laboratory. Finally the power capacity limit of the positioner arising from the limit for feeding energy to the inertial drive to overcome. The solution according to the invention is given in claim 1. Improvements and further constructions based on the invention are given in the other claims.

The slider according to the invention consists of one part, that means all mass units and flexible units forming the slider are joined together to one compound. However, the single mass units and the single flexible units can be manufactured separately and independently. It is preferable to produce them all together out of one body.

With the help of at least one of the flexible units the pressure of the slider on the sliding surface can be adjusted by bending it to achieve a pretension. By this the strength of the frictional force can be varied in a wide range.

The slider according to the invention consists of one part including at least one flexible deformable bending unit and of at least one heavy mass unit. Theoretically the flexible unit could also be heavy if it could in spite of that be made flexible relative to the mass unit or theoretically the mass unit could also be flexible if it could be heavy relative to the flexible unit in spite of its mass. As known it is not possible to form extremely heavy and at the same time extremely flexible solids.

As said before there is a limit for feeding power into the inertial drive. This problem is encountered with the mass unit integrated into the slider according to the invention leading to a powerful piezo drive in spite of the limit for (reasonable) power consumption. The invention in principle distinctly improves the degree of effectiveness of the piezo actuator. A suitable electrical impulse can accelerate a heavy mass of the slider synchronously to the movement of the piezo and a rapid changing of the piezo motion forces the heavy mass to slide due to its inertia despite of a very strong frictional force.

The high inertial mass combined with the high frictional force lead to several advantages:

a. With the slider according to the invention heavy objects are movable.

b. The slider according to the invention adjusted with a high frictional force can exert high forces.

c. Due to its robustness the positioner according to the invention operates in a wide range of pre-bending of the flexible unit of the slider, that means the adjustment of the slider is extremely tolerant and insensitive to changes during operation (dirt humidity, corrosion, etc.), which act as a change in the frictional force of the slider.

d. For the movement of the slider according to the invention small voltages of dimension 10 Volts applied to the piezo actuator(s) are sufficient thus, in contrast to many traditional inertial drives, no high voltage is needed for operation which makes it considerably easier to handle.

e. A further advantage of the invention is the possibility to adjust the displacement of the relative motion per applied impulse between the slider and the piezo actuator by adjusting the flexible unit of the slider thus setting the contact force between the slider and the sliding surface. By this particularly the displacement of the relative motion can be made smaller than the range of the piezo actuator thus allowing to reach any position with atomic precision on a scale of min to cm.

f. Due to the robustness of the positioner according to the invention the slider moves in a uniform and reproducible way with a velocity up to millimeter per second.

In addition to what was said before the strength of the frictional force between the sliding surface and the slider depends also on the size and the condition of the area of contact. This parameter can be selected during the manufacturing and then stays constant and fixes the range in which the flexible unit of the slider can be adjusted. Nevertheless, adjustment is achievable if at least one of the mass units consists of a body with a formed surface so that the size of the area of contact between the mass unit and the sliding surface can be chosen and/or if one or the mass units are of different materials and can have holes.

The requirements for the flexible unit of the slider can be met by an elastic thin wire as proposed in PCT/EP 93/02414. A flexible unit can as well be formed by thinning out a mass unit at least one place to an extent that at this place a flexibility is induced forming an extra flexible unit. This construction has the advantage that manufacturing out of one piece is possible avoiding seams between different materials.

According to a further idea of the invention an object can be fixed to the slider that is transported with the slider. If necessary this object can be positioned with the same accuracy as the slider.

If not the piezo actuator part is fixed in space but according to a further idea of the invention the slider is fixed in space by fixing it at least one end to a large heavy object, the relative motion leads to movements of the piezo actuator relative to the large heavy object. Thus complex positioning constructions are possible which are able to position in various directions in space, particularly as xy-table, xyz-stand, tripod, tilting table or rotation element.

Due to the above described large force reserves of the slider according to the invention complex positioning can be carried out in several directions of space by combining of several of these positioning units and by fixing of objects to its sliders, particularly as xy-table, xyz-stage, tripod, tilting table or rotation element.

The invention relates to an electromechanical positioning unit formed as an inertial drive to position objects with atomic scale positioning precision and with displacement ranges up to centimeters. The positioning unit contains at least one tube-shaped piezo electric actuator with electrodes for connecting it to variable voltages for transmitting electrically controllable inertial driving motion to a slider that moves inside said piezo actuator(s) in the direction of the piezo movements along a tube-shaped sliding surface. The relative motion between slider and piezo actuator arises from the fact that the slider can not follow relative fast motions of the sliding surface but can follow relative slow motions of the sliding surface. The object of the invention is a slider which consists of at least one unit of higher mass (mass unit) and of at least one flexible deformable unit (flexible unit), said flexible unit allowing the strength of the frictional force to be adjusted and said mass unit providing high loading capacity of the positioning unit. By this combination heavy loads can be positioned and forces necessary for tools can be exerted.

BRIEF DESCRIPTION OF THE DRAWINGS

Further details of the invention are now illustrated by sketches of implementing example wherein.

DETAILED DESCRIPTION OF PREFERRED EMBODIMENTS

Figure 1:
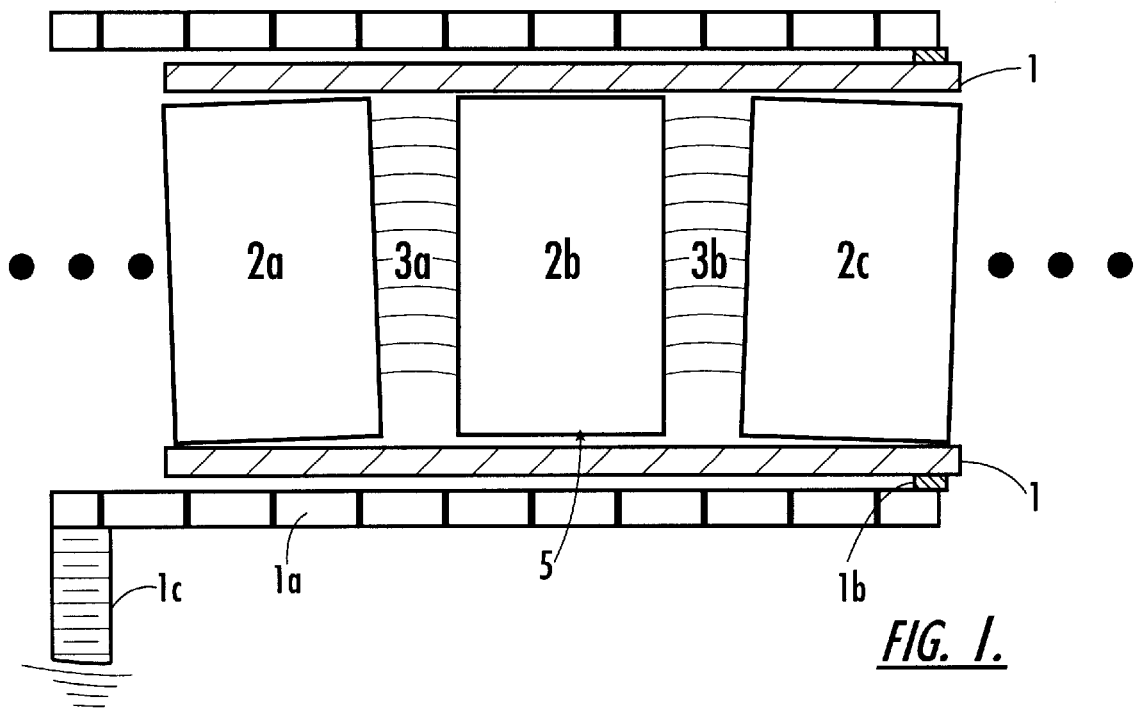
FIG. 1 shows a first embodiment of a slider of the present invention slidably supported in a piezoelectric actuator.
Figure 2:
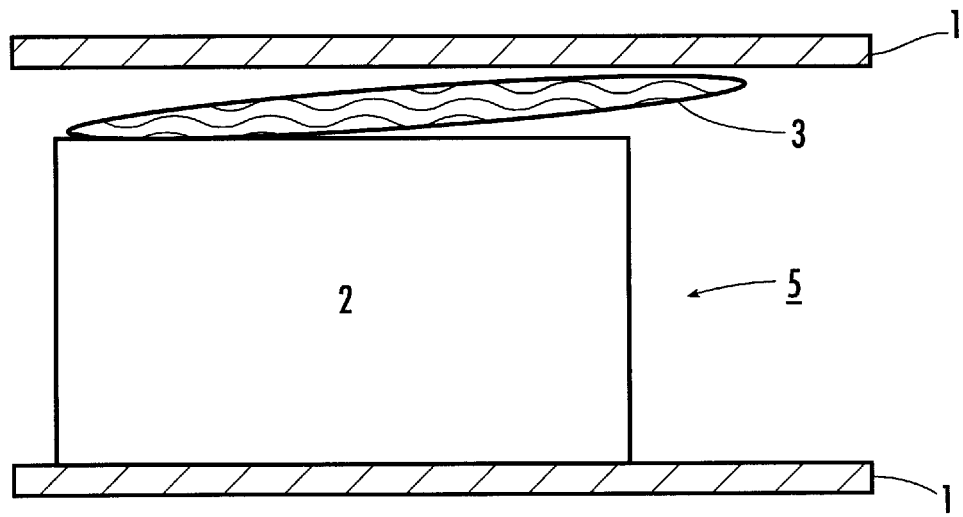
FIG. 2 shows a second embodiment of a slider of the present invention slidably supported in a piezoelectric actuator.

One form of the slider according to the invention is shown in FIG. 1. The slider is disposed within a piezoelectric actuator (shown in FIG. 1 only for clarity of illustration in the other Figs.). The piezoelectric actuator conventionally includes a piezoelectric element 1a surrounding a tubular frictional sliding surface 1. The piezoelectric element is coupled to the sliding surface 1 by a ring 1b and clamped or fixed to a surface or structure, e.g., a floor, by support 1d. Preferably the distance between the coupling ring 1b and the support 1d is as large as possible to provide an appropriate piezo travel or sweep width. The slider is indicated overall at 5 and in FIG. 1 consists of mass units 2a, 2b, 2c etc. and of several flexible deformable units 3a, 3b, 3c etc. The number of units is not critical for the principle, only one unit of each 2, 3 is necessary as shown in FIG. 2. This allows various forms of sliders that can be used to integrate objects like electrical lines, sensors, glass fibers or a hose into the slider and to transport them with the slider according to the invention.

Figure 3:
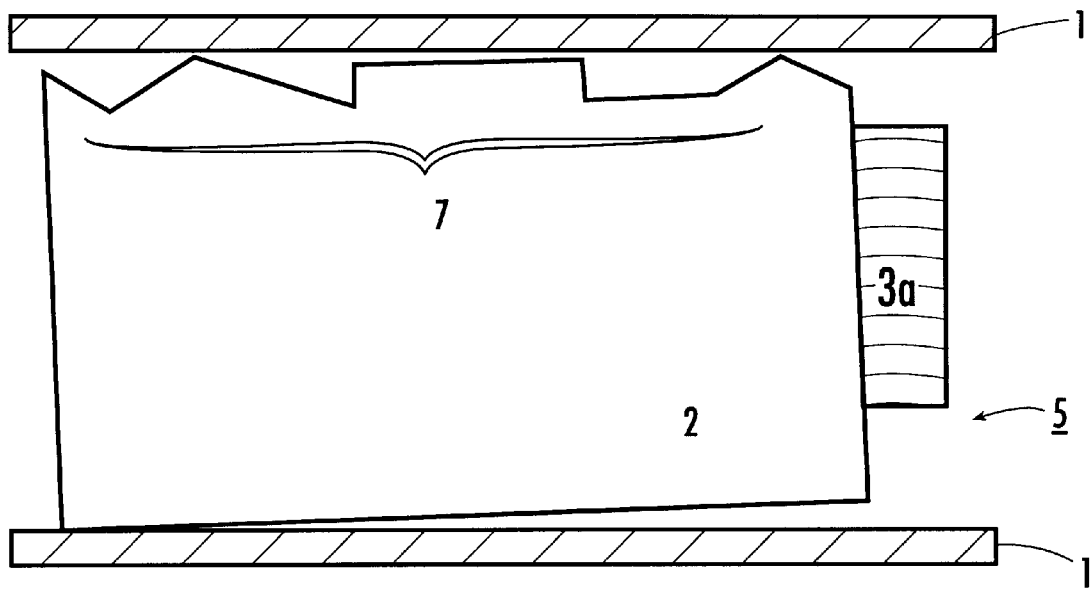
FIG. 3 shows a third embodiment of a slider of the present invention slidably supported in a piezoelectric actuator, the slider having a selected contoured surface for contacting the actuator.

The strength of the frictional force between the sliding surface 1 and the slider 5 can besides other means also be determined by the size and condition of the slider surface 7 during manufacturing of the slider. This is achieved by forming the surface 7 of at least one of the mass units 2 thus determining the size of the contact area between surface 7 and the sliding surface 1 as shown in FIG. 3.

Figure 4:
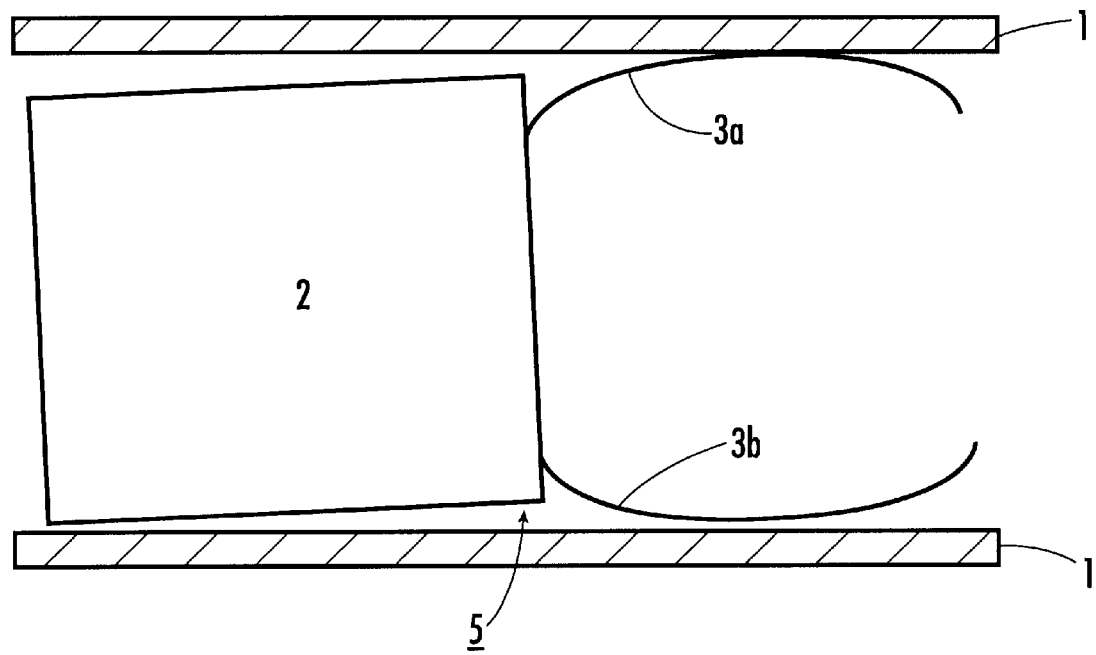
FIG. 4 shows a fourth embodiment of a slider of the present invention slidably supported in a piezoelectric actuator, the slider including two flexible and deformable wire shaped members engaging the actuator.
Figure 5:
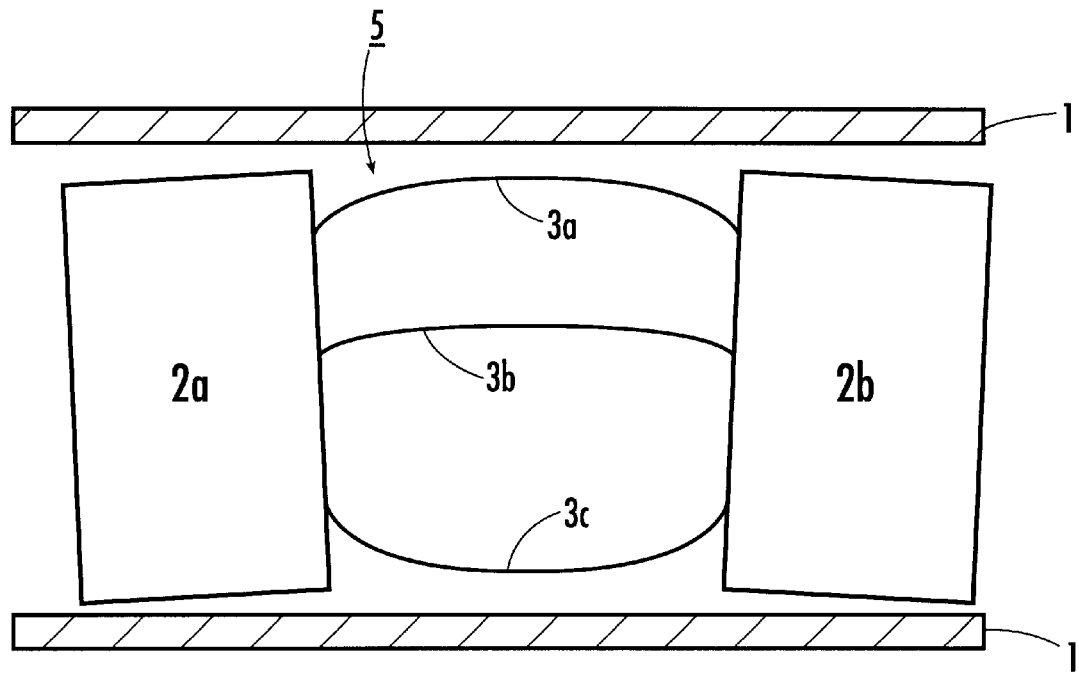
FIG. 5 shows a fifth embodiment of a slider of the present invention slidably supported in a piezoelectric actuator, the slider including two heavy members connected by three flexible and deformable wire shaped members extending therebetween.
Figure 6:
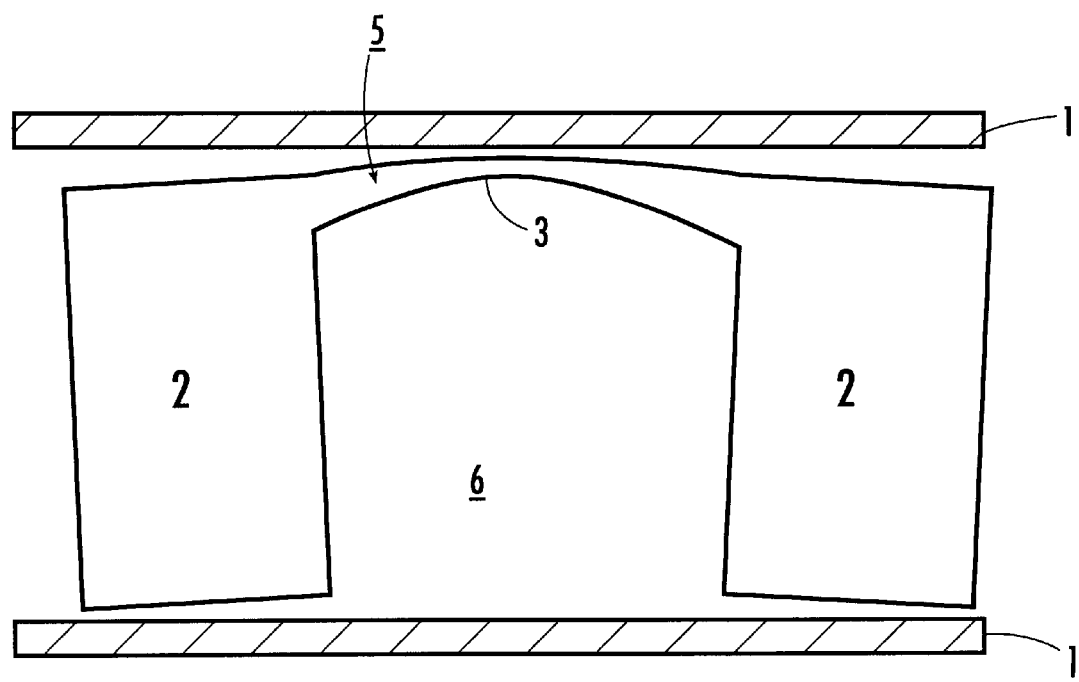
FIG. 6 shows a sixth embodiment of a slider of the present invention slidably supported in a piezoelectric actuator, the flexible and deformable member of the slider comprising a thinned down portion of the heavy mass.

Further special forms of the slider according to the invention are shown in FIGS. 4 and 5. The flexible units 3a, 3b etc. consist of elastic thin wires and can look like lashes; (FIG. 4) on one end of the mass unit or can form connections between two mass units (FIG. 5). Here also the number of wires is not critical; only one wire is necessary for the principle according to the invention. As shown in FIG. 6 a flexible unit 3 can also be generated by thinning out the mass unit 2 at least one place to an extent that this place becomes flexible and presents a flexible unit. This principle is applicable to several places on the slider.

Figure 7:
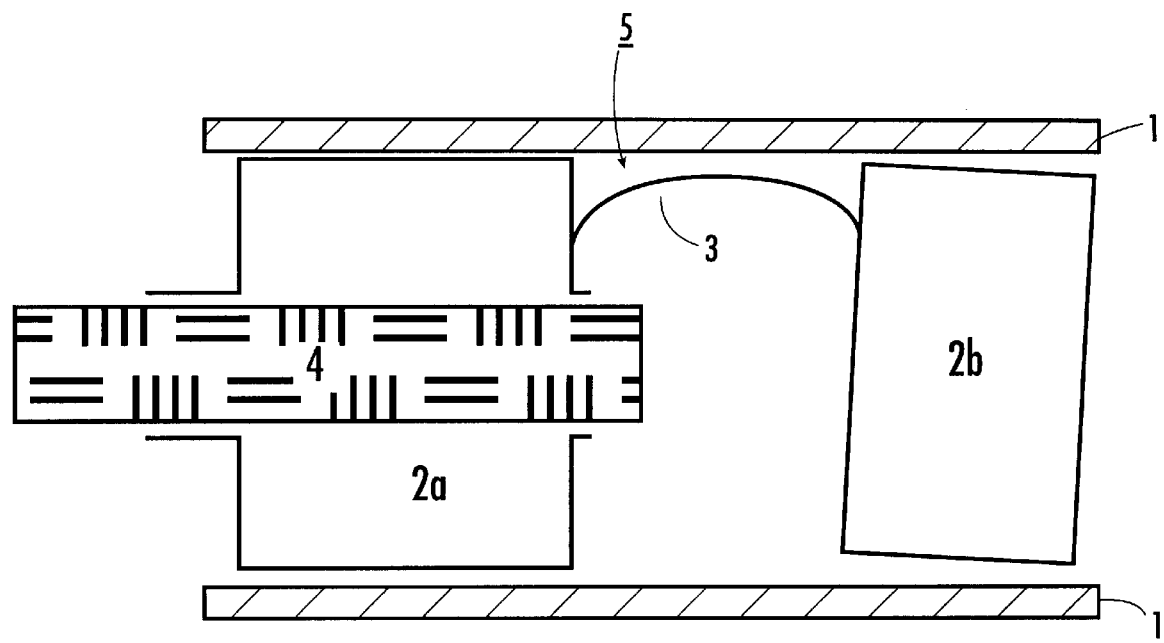
FIG. 7 shows a seventh embodiment of a slider of the present invention slidably supported in a piezoelectric actuator, the slider including an object carried by the heavy member of the slider for weighing down of the slider.

In all shown examples the mass unit can consist of several materials and/or can have axial holes according to the purpose of the application. FIG. 7 shows an example where an object 4 is fixed inside one of the mass units 2a. This can be a rod or can serve as a part of a xy-positioner or can be a pike for scratching material or for cutting lines of printed circuit boards etc.

Figure 8:
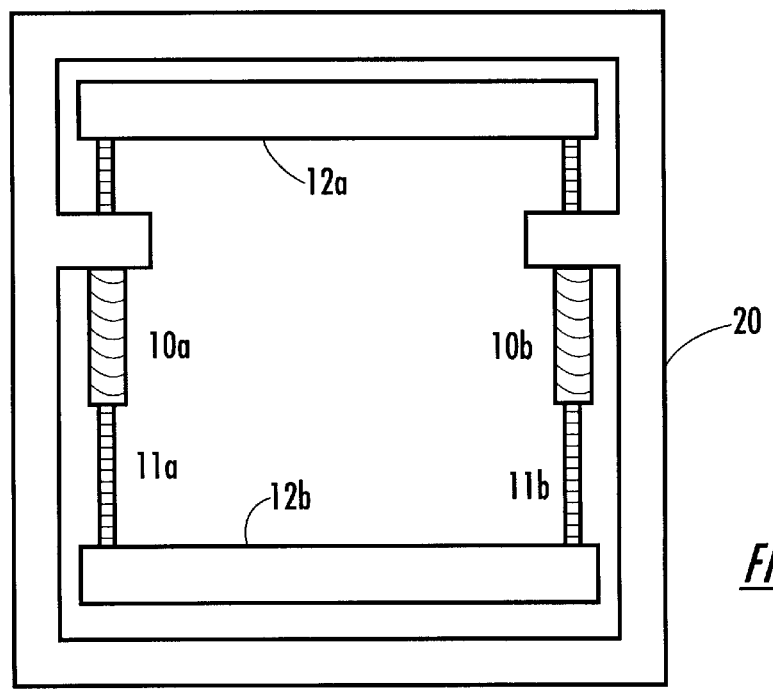
FIG. 8 shows a positioning table utilizing electromechanical positioning units of the present invention.
Figure 9:
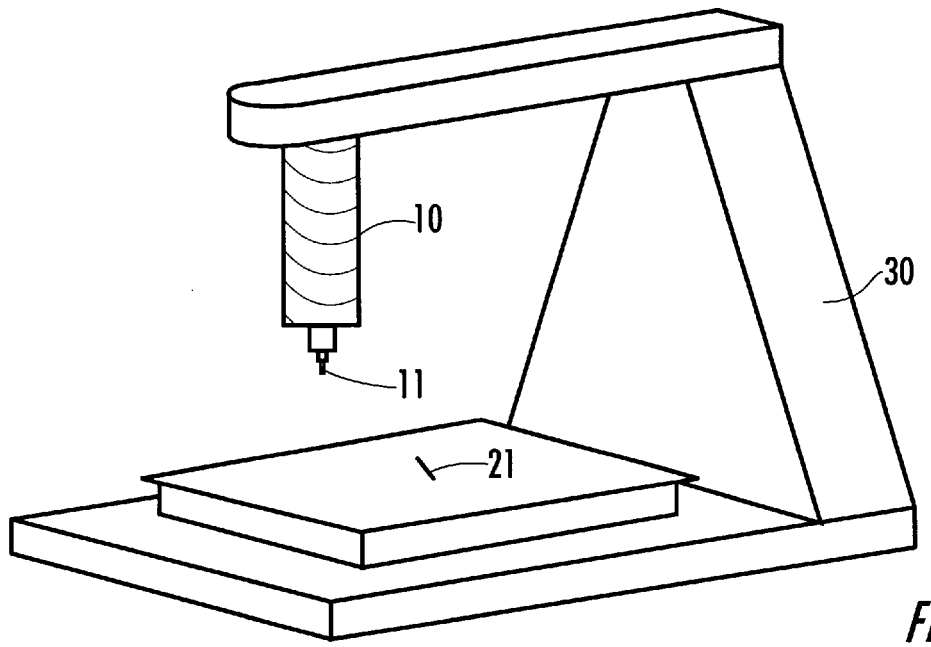
FIG. 9 shows an xy-table utilizing electromechanical positioning units of the present invention.
Figure 10:
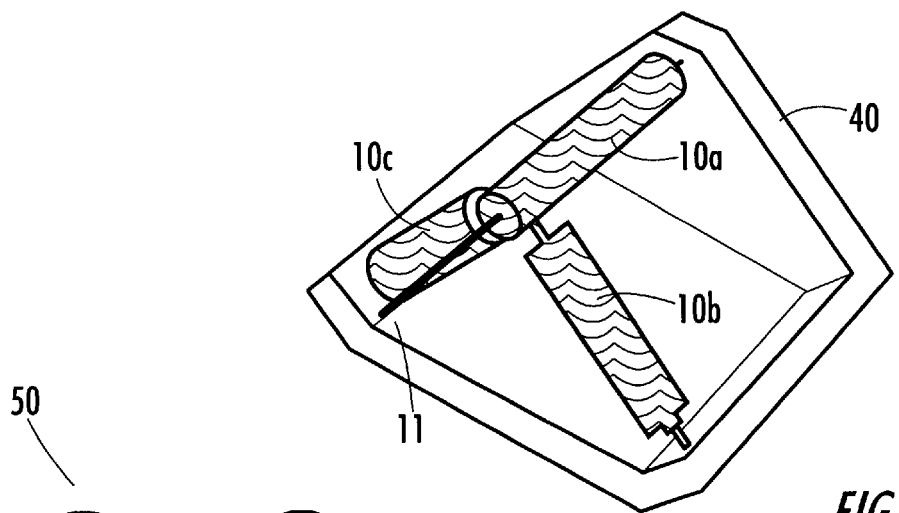
FIG. 10 shows a combination of three electromechanical positioning units of the present invention connected by flexible hinges for movement of an object in three dimensions.

The combination of several of the positioners according to the invention forming complex tools is shown in FIGS. 8 to 10. In FIG. 8 one layer of the xy-table mentioned above is shown. Two of the positioners 10a, 10b are fixed parallel in one level. Each of the sliders has, as an object to be moved, a rod 11a, 11b with each rod extending far beyond each piezoelectric actuator, i.e., positioner 10. At the ends of the rods two plates 12a, 12b are fixed which are moved uniformly along the direction of motion of the sliders when the sliders are moved synchronously. Thus according to the invention a positioning table is achieved that has nanometer precision and has a displacement range of mm to cm. With this for example loads of 100 Grams can be moved with velocities of 1 min per second.

A combination of positioners according to the invention can be used for a scanning probe measuring device and as a tool as shown in FIG. 9. The xy-table 21 consists of two tables (see FIG. 8) 90 degrees rotated put on each other containing four of the positioners according to the invention. The z-component consists of a fifth positioner according to the invention. Its slider supports the object 11, which can be a tip for scratching, welding or bonding respectively or a sensor for electric current,, magnetic fields, light, chemicals, forces etc. or a hose or a glass fiber.

If three positioners according to the invention are combined by flexible connections as shown in FIG. 10 allowing only bending but not stretching nor tossing nor buckling, the object 11 can be positioned in three dimensions.

Figure 11:
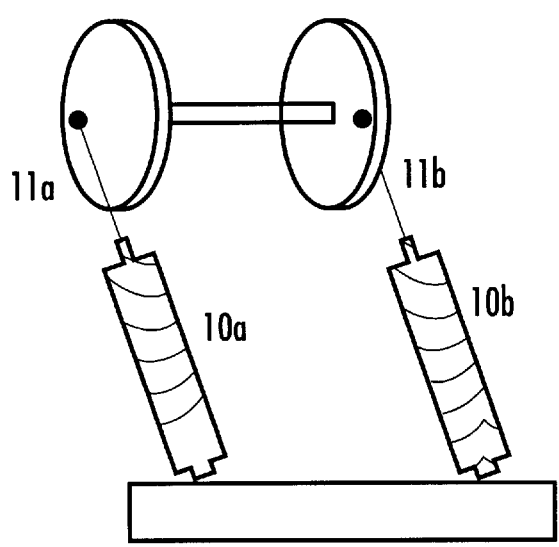
FIG. 11 shows a device for rotation of an object using electromechanical positioning units of the present invention.

Rotations can be executed by combining at least two of the positioners 10a and 10b according to the invention as shown in FIG. 11. The one-axis movements of the slider arms 11a, 11b are transmitted to two points of one or two turntables under a large angular displacement. The angular displacement of the two points avoids that none of the positioners can transmit a force to the rotational motion. The mechanical transmission can follow the known excenter principle used in steam engines.

None of the application examples shown above can be realized with the traditional sliders of the one-axis inertial drives as described in PCT/EP 93/02414 and in DE 38 22 504 Al or in Review Sci. Instr. 63 (1). Only the properties of the positioner according to the invention supply the necessary robustness.

What is claimed is:

1. An electromechanical positioning unit for one-dimensional positioning of an object with nanometer precision and with positioning displacements up to centimeters, comprising:

(a) a piezoelectric actuator; and (b) a slider slidably supported in contact with said actuator for sliding movement within said actuator, said slider comprising (i) a first member for receiving the object to be positioned, and (ii) a flexible and deformable second member joined to said first member, said first member having a higher mass than said second member;

(c) whereby bending deformation of said flexible second member results in adjustment of a frictional force between said slider and said actuator.

2. An electromechanical positioning unit according to claim 1, further comprising a third flexible and deformable member joined to said first member, said first member having a higher mass than said third member, bending deformation of said flexible third member also resulting in adjustment of the frictional force between said slider and said actuator.

3. An electromechanical positioning unit according to claim 1, wherein said first member comprises a composite of materials of different weights.

4. An electromechanical positioning unit according to claim 1, wherein said first member includes openings for receiving objects for increasing the weight of said first member relative to said second member.

5. An electromechanical positioning unit according to claim 1, wherein said second member comprises a flexible thin wire.

6. An electromechanical positioning unit according to claim 1, wherein said second member comprises a thinned down portion of said first member.

7. An electromechanical positioning unit according to claim 1, wherein said slider is fixed to an object having a substantially greater weight than said slider whereby actuation of said actuator results in movement of said actuator relative to said object.

8. An electromechanical positioning unit according to claim 1, wherein said second member is slidably supported in contact with said actuator.

9. An electromechanical positioning unit according to claim 1, wherein said first member is slidably supported in contact with said actuator.

10. An electromechanical positioning unit according to claim 9, wherein said first member has a selected surface contour for selected frictional contact with said actuator.

11. An electromechanical positioning unit according to claim 1, wherein said first member and said second member are slidably supported in contact with said actuator.

12. An electromechanical positioning unit according to claim 1, wherein said actuator is tube-shaped and said slider is disposed within said actuator.

13. A device for positioning an object in two dimensions including a plurality of electromechanical positioning units according to claim 1.

14. A device for positioning an object in three dimensions including a plurality of electromechanical positioning units according to claim 1.

15. A device for rotation of an object including a plurality of electromechanical positioning units according to claim 1.

16. An electromechanical positioning unit for one-dimensional positioning of an object with nanometer precision and with positioning displacements up to centimeters, comprising:
   (a) a piezoelectric actuator; and
   (b) a slider slidably supported in contact with said actuator for sliding movement relative to said actuator, said slider comprising
      (i) two heavy members at least one of which receives the object to be positioned, and
      (ii) at least one flexible and deformable member interconnecting said two heavy members, each said heavy member having a higher mass than said at least one flexible and deformable member,
   (c) whereby bending deformation of said at least one flexible and deformable member results in adjustment of a frictional force between said slider and said actuator.

17. An electromechanical positioning unit according to claim 16, wherein said at least one flexible and deformable member is slidably supported in contact with said actuator.

18. An electromechanical positioning unit according to claim 16, wherein said actuator is tube-shaped and said slider is disposed within said actuator.

19. An electromechanical positioning unit for one-dimensional positioning of an object with nanometer precision and with positioning displacements up to centimeters, comprising:
   (a) a piezoelectric actuator; and
   (b) a slider slidably supported in contact with said actuator for sliding movement relative to said actuator, said slider comprising
      (i) three heavy members at least one of which receives the object to be positioned, and
      (ii) at least two flexible and deformable members interconnecting said three heavy members, each said heavy member having a higher mass than said at least two flexible and deformable members,
   (c) whereby bending deformation of said at least two flexible and deformable members results in adjustment of a frictional force between said slider and said actuator.

20. An electromechanical positioning unit according to claim 19, wherein said at least two flexible and deformable members are slidably supported in contact with said actuator.

21. An electromechanical positioning unit according to claim 19, wherein said actuator is tube-shaped and said slider is disposed entirely within said actuator.

* * * * *